(12) United States Patent
Anderson et al.

(10) Patent No.: US 6,535,780 B1
(45) Date of Patent: Mar. 18, 2003

(54) HIGH SPEED PROGRAMMER SYSTEM

(75) Inventors: George Leland Anderson, Bothell, WA (US); Robin Edward Cameron, Snohomish, WA (US); Scott Allen Fern, Kent, WA (US)

(73) Assignee: Data I/O Corporation, Redmond, WA (US)

( * ) Notice: Subject to any disclaimer, the term of this patent is extended or adjusted under 35 U.S.C. 154(b) by 0 days.

(21) Appl. No.: 09/471,675

(22) Filed: Dec. 24, 1999

Related U.S. Application Data

(60) Provisional application No. 60/164,782, filed on Nov. 10, 1999.

(51) Int. Cl.[7] .............................................. G06F 19/00
(52) U.S. Cl. ...................................................... 700/121
(58) Field of Search .............................. 700/90, 95, 47, 700/121; 710/52, 62, 72

(56) References Cited

U.S. PATENT DOCUMENTS

| | | | |
|---|---|---|---|
| 5,036,488 A | * 7/1991 | Motarjemi | 365/52 |
| 5,535,873 A | 7/1996 | Sakamoto et al. | 198/434 |
| 5,548,554 A | * 8/1996 | Pascucci et al. | 365/200 |

FOREIGN PATENT DOCUMENTS

| | | | |
|---|---|---|---|
| EP | 1 018 862 | 7/2000 | H05K/13/04 |
| WO | WO 99 12406 | 3/1999 | H05K/13/04 |

OTHER PUBLICATIONS

BP-6500 In-Line Programming System brochure, BP Microsystems, Inc. 1999, 2 pages.
BP-6500 In-Line Programming System Data Sheet, BP Microsystems, Inc. 1999, 1 page.
"BP-6500 In-Line Programming & Fifth Generation Technology", BP Microsystems, Inc. 1999, 7 pages.

* cited by examiner

*Primary Examiner*—Thomas M. Heckler
(74) *Attorney, Agent, or Firm*—Mikio Ishimaru

(57) ABSTRACT

A programmer system and method of programming programmable micro devices with significantly increased throughput are provided. The programmer system includes a multiple number of sockets for programming a multiple number of micro devices simultaneously. A buffer circuit is also provided which is capable of providing a number of logic levels suitable to drive different micro devices during programming by a programmer system adapted to program a number of micro devices simultaneously. A method for programming a programmable micro device is further provided which uses the standard bus cycle from a processor for programming. Finally, a data compare circuit and a method for verifying data programmed by a programmer in a plurality of programmed micro devices using a single readback operation is also disclosed.

28 Claims, 4 Drawing Sheets

HIGH SPEED PROGRAMMER SYSTEM

CROSS-REFERENCE TO RELATED APPLICATION(S)

This application claims the benefit of U.S. Provisional Patent Application No. 60/164,782, filed on Nov. 10, 1999, which is incorporated herein by reference thereto.

The present application contains subject matter related to a copending U.S. Patent Application by Lev M. Bolotin entitled "MANUFACTURING SYSTEM WITH FEEDER/PROGRAMMING/BUFFER SYSTEM". The related application is assigned to Data I/O Corporation, is identified by Ser. No. 09/418,732, and is hereby incorporated by reference.

The present application contains subject matter related to a copending U.S. Patent Application by Bradley Morris Johnson, Lev M. Bolotin, Simon B. Johnson, Carl W. Olson, Bryan D. Powell, and Janine Whan-Tong entitled "FEEDER/PROGRAMMING/BUFFER OPERATING SYSTEM". The related application is assigned to Data I/O Corporation, is identified by Ser. No. 09/419,172, now U.S. Pat. No. 6,449,523 and is hereby incorporated by reference.

The present application also contains subject matter related to a copending U.S. Patent Application by Simon B. Johnson, George Leland Anderson, Lev M. Bolotin, Bradley Morris Johnson, Mark Sean Knowles, Carl W. Olson, and Vincent Warhol entitled "FEEDER/PROGRAMMING/BUFFER CONTROL SYSTEM AND CONTROL METHOD". The related application is assigned to Data I/O Corporation, is identified by Ser. No. 09/418,901, and is hereby incorporated by reference.

TECHNICAL FIELD

The present invention relates generally to a manufacturing system for electronic products, and more particularly to continuous production of electronic circuit boards incorporating programmable integrated circuits.

BACKGROUND ART

In the past, certain operations of electronic circuit board assembly were performed away from the main production assembly lines. While various feeder machines and robotic handling systems would populate electronic circuit boards with integrated circuits, the operations related to processing integrated circuits, such as programming, testing, calibration, and measurement were performed in separate areas on separate equipment rather than being integrated into the main production assembly lines.

For example, in the programming of programmable devices such as electrically erasable programmable read-only memories (EEPROMs) and Flash EEPROMs, separate programming equipment was used which was often located in a separate area from the circuit board assembly lines. There were a number of reasons why programming was done off-line.

First, the programming equipment was relatively large and bulky. This was because of the need to accurately insert and remove programmable devices at high speeds into and out of programming sockets in the programmer. Since insertion and removal required relatively long traverses at high speed and very precise positioning, very rigid robotic handling equipment was required. This rigidity requirement meant that the various components had to be relatively massive with strong structural support members to maintain structural integrity and precision positioning of the pick and place system moving at high speeds. Due to the size of the programming equipment and the limited space for the even larger assembly equipment, they were located in different areas.

Second, a single high-speed production assembly system could use up programmed devices faster than they could be programmed on a single programming mechanism. This required a number of programmers which were generally operated for longer periods of time in order to have a reserve of programmed devices for the production assembly systems. This meant that the operating times and the input requirements were different between the two systems.

Third, no one had been able to build a single system which could be easily integrated with both the mechanical and electronic portions of the production assembly systems. These systems are complex and generally require a great deal of costly engineering time to make changes to incorporate additional equipment.

A major problem associated with programming the programmable devices in a separate area and then bringing the programmed devices into the production assembly area to be inserted into the electronic circuit boards was that it was difficult to have two separate processes running in different areas and to coordinate between the two separate systems. Often, the production assembly line would run out of programmable devices and the entire production assembly line would have to be shut down. At other times, the programming equipment would be used to program a sufficient inventory of programmed devices to assure that the production assembly line would not be shut down; however, this increased inventory costs. Further problems were created when the programming had to be changed and there was a large inventory of programmed integrated circuits on hand. In this situation, the inventory of programmable devices would have to be reprogrammed with an accompanying waste of time and money.

While it was apparent that a better system would be desirable, there appeared to be no way of truly improving the situation. There were a number of apparently insurmountable problems that stood in the way of improvement.

First, the operating speeds of current production assembly lines so greatly exceeded the programming speed capability of conventional programmers that the programmer would have to have a much greater throughput than thought to be possible with conventional systems.

Second, not only must the programmer be faster than existing programmers, it would also have to be much smaller. The ideal system would integrate into a production assembly line, but would do so without disturbing an existing production assembly line or requiring the lengthening of a new production assembly line over that of the length without the ideal system. Further, most of these production assembly lines were already filled with, or designed to be filled with, various types of feeding and handling modules which provide limited room for any additional equipment.

Third, any programmer tied into the production assembly line would have to also tie into the electronic feeders of the production assembly. This would require integration of any control software with the production system software for communication and scheduling purposes. This would be a problem because production assembly line system software was not only complex, but also confidential and/or proprietary to the manufacturers of those systems. This meant that the integration must be done with the cooperation of the manufacturers, who were reluctant to spend engineering effort on anything but improving their own systems, or must be done with a lot of engineering effort expended on understanding the manufacturers' software before working on the programmer's control software.

Fourth, the mechanical interface between a programmer and the production equipment needed to be highly accurate for placing programmed devices relative to the pick-and-place handling equipment of the production assembly system.

Fifth, there are a large number of different manufacturers of production handling quipment as well as production manufacturing equipment. This means that the a large number of different production assembly line configurations would have to be studied and major compromises in design required for different manufacturers.

Sixth, the ideal system would allow for changing quickly between different micro devices having different configurations and sizes.

Seventh, the ideal system needed to be able to accommodate a number of different micro device feeding mechanisms including tape, tape stacker, tube, tube stacker, and tape and reel.

Finally, there was a need to be able to quickly reject micro devices which failed during the programming.

All the above problems seem to render an effective solution impossible with the major problem being that the current state of this technology was such that it was not possible for programming equipment to keep up with the production line. Basically, it takes time to program an electronic device. A solution has been long sought for increasing the throughput of the integrated circuit programming systems.

DISCLOSURE OF THE INVENTION

The present invention provides a programmer system with significantly increased throughput. The system solves most of the problems previously occurring with the speed/throughput capability of conventional programmer systems while being optimized to provide efficient operation of the overall system.

The present invention provides a programmer system with a multiple number of sockets for programming a multiple number of micro devices simultaneously. Thus, the programming throughput can be increased significantly.

The present invention further provides a buffer circuit for a programmer system that is designed to program a number of different micro devices. The buffer circuit provides a plurality of logic levels suitable to drive different micro devices during programming.

The present invention further provides a method for programming a programmable micro device using a processor such that the processor address and data are used to supply the address and data required by the micro device. Instead of using a special bus cycle, the present invention uses the standard bus cycle from a processor for programming. Thus, the programming speed and the programming throughput are increased significantly.

The present invention still further provides a data compare circuit and a method for verifying data programmed by a programmer in a plurality of programmed micro devices using a single read-back operation. Thus, the programming speed and the programming throughput for a programmer that performs multi-device programming can be increased significantly.

The present invention further provides a processing mechanism which includes a processor for generating address signals, data signals and control signals; a pin driver module coupled to the processor; a backplane module coupled to the pin driver module; and at least one socket coupled to the backplane module. The at least one socket is used for placement of the unprocessed micro devices. The pin driver module routes the address signals, data signals and control signals to the backplane module, and provides a first plurality of voltages to the buffer circuit. The backplane module routes the address signals, data signals and control signals to the at least one socket, and provides a second plurality of voltages to the at least one socket. The programming mechanism substantially solves the throughput problem previously facing such systems.

The present invention further provides a buffer circuit for a processing mechanism capable of processing unprocessed micro devices into processed micro devices. The processing mechanism includes a processor for generating control data signals and processing data signals and for receiving device data signals; a voltage reference source for providing a voltage reference, and a $V_{CC1}$ voltage supply for providing a $V_{CC1}$ voltage; and at least one socket for placement of the unprocessed micro devices. The buffer circuit includes a digitalto-analog converter (DAC) coupled to the processor and the voltage reference source; an amplifier coupled to the DAC; and a level-shifting translating buffer coupled to the amplifier, the processor, the $V_{CC1}$ voltage supply, and the socket for transferring processing data signals from the processor to the unprocessed micro devices and for transferring the device data signals from the processed micro devices to the processor. The DAC is responsive to the control data signals and the voltage reference to generate a first variable DC voltage. The amplifier is responsive to the first variable DC voltage to generate a second variable DC voltage. The level-shifting translating buffer is responsive to the $V_{CC1}$ voltage and the second variable DC voltage for providing a plurality of logic levels for the device data signals. The buffer circuit substantially solves the throughput problem previously facing processing mechanism such as programmer systems.

The present invention further provides a method for programming a programmable micro device using a processor. The programmable micro device includes a plurality of memory locations for storing data. The memory locations are identified by a respective plurality of addresses. The programmable micro device is coupled to the processor via an address bus, a data bus and a control bus. The method includes the steps of: (a) providing a first address from the processor to the programmable micro device over the address bus; (b) providing a first data corresponding to the first address from the processor to the programmable micro device over the data bus; and (c) providing a first control signal from the processor to the programmable micro device over the control bus to enable the programmable micro device to accept the first data from the processor at a memory location identified by the first address in the programmable micro device. The programming method substantially solves the throughput problem previously facing programmer systems.

The present invention further provides a programming mechanism capable of programming unprogrammed micro devices into programmed micro devices. The programmed micro devices having a plurality of memory locations for storing data. The plurality of memory locations is identified by a respective plurality of addresses. The programming mechanism includes a plurality of sockets for placement of processed micro devices; a plurality of data buffer/registers, wherein each of the plurality of data buffer/registers is coupled to a respective one of the plurality of sockets for receiving a first data stored in a first address in each of the programmed micro devices; a plurality of compare circuits, wherein each of the plurality of compare circuits has a first input and a second input and one output, and wherein the first input of each of the plurality of compare circuits is coupled to a respective one of the data buffer/registers for receiving the first data; an expected data register coupled to the second input of each of the respective plurality of compare circuits for providing a first expected data; a processor bus; and a processor coupled to the output of each of the plurality of compare circuits over the processor bus, wherein each of the compare circuits provides a first logic level at the output if the first data matches with the first expected data, and provides a second logic level at the output if the first data does not match with the first expected data. The programming mechanism substantially solves the throughput problem previously facing programmer systems.

The above and additional advantages of the present invention will become apparent to those skilled in the art from a reading of the following detailed description when taken in conjunction with the accompanying drawings.

BEST MODE FOR CARRYING OUT THE INVENTION

Programming System

The present invention provides a programmer system with multiple number of sockets for programming a multiple number of micro devices simultaneously. Thus the programming throughput can be increased significantly.

Figure 1:
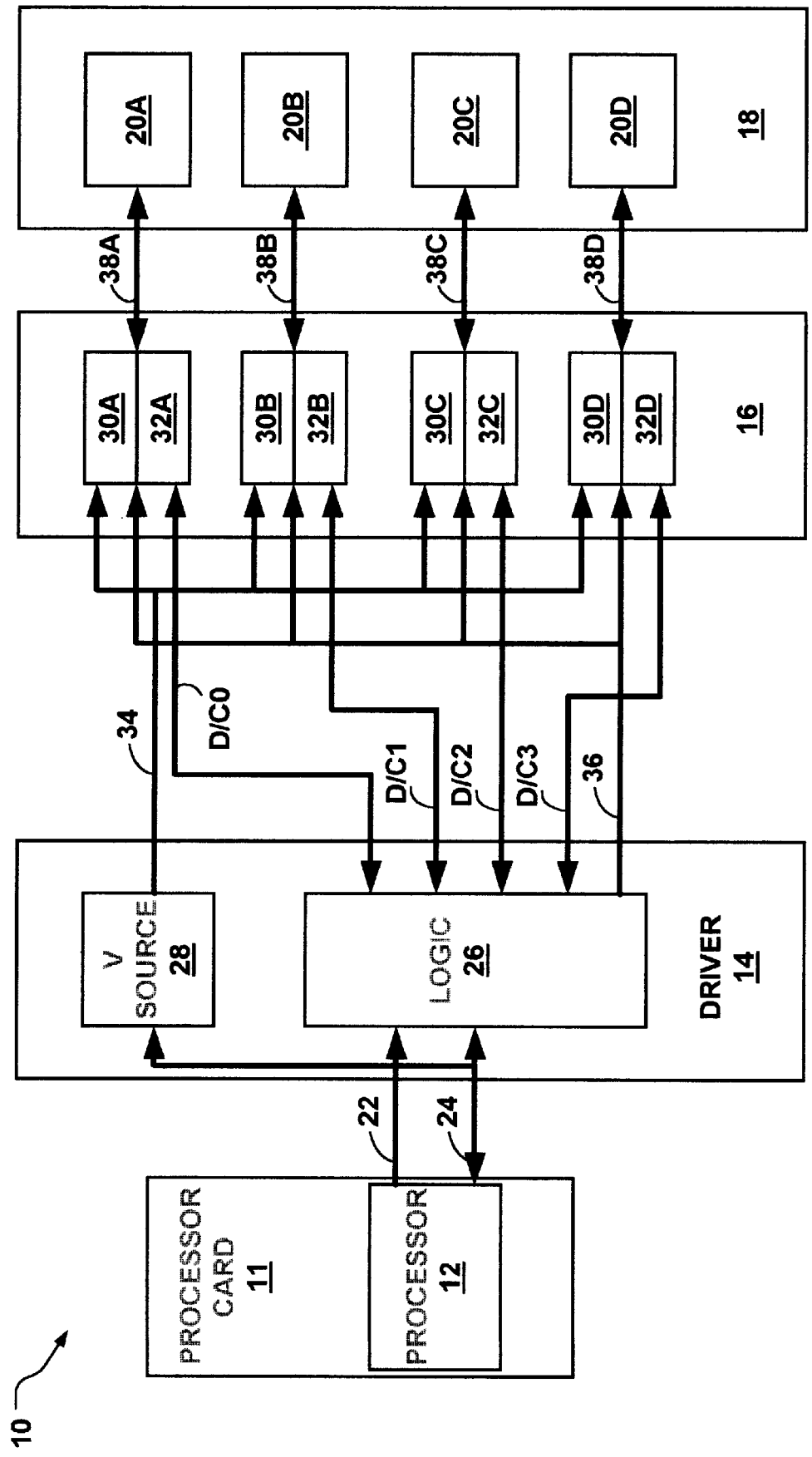
FIG. 1 is an overall block diagram of a programmer system of the present invention.

Referring now to FIG. 1, therein is shown a programmer system 10. The programmer system 10 includes a processor card 11 with a microprocessor, such as a processor 12 located thereon, a pin driver module 14, a backplane module 16, and a socket adapter 18 with four sockets 20A through 20D mounted thereon.

The processor 12 is coupled to the pin driver module 14 over an address bus 22 and a data/control bus 24. The processor 12 generates address, data, and control signals.

The pin driver module 14 includes a logic circuit 26 for routing the address, data, and control signals to the backplane module 16, and a voltage source circuit 28 for providing voltages to the backplane module 16. The logic circuit 26 may be a dedicated integrated circuit or a field programmable gate array (FPGA). The voltage source circuit 28 includes a conventional digital-to-analog converter (DAC) and conventional calibration circuits (not shown). The voltage source circuit 28 generates a $V_{CC}$ supply voltage which is the normal operating supply voltage of the micro devices to be programmed and a programming voltage known as $V_{PP}$.

The backplane module 16 includes a plurality of relay switch circuits, four relay switch circuits 30A through 30D, and a plurality of buffer circuits, four buffer circuits 32A through 32D. The voltage source circuit 28 is coupled to the relay switch circuits/buffer circuits 30A/32A through 30D/32D over a power bus 34. The logic circuit 26 is coupled to each of the relay switch circuits/buffer circuits 30A/32A through 30D/32D over data/control bus D/C0, D/C1, D/C2, and D/C3, respectively. The logic circuit 26 is also coupled to each of the relay switch circuits/buffer circuits 30A/32A through 30D/32D over an address bus 36.

The relay switch circuits/buffer circuits 30A/32A through 30D/32D are coupled to sockets 20A through 20B over busses 38A through 38D.

The backplane module 16 also controls status light-emitting diodes (LEDs) (not shown) for status of the sockets (20A through 20D) of a micro device that is being programmed. Status may indicate that the micro device is failing for some reason or that it is passing for some reason. It should be noted that the LEDs are optional in the practice of the present invention.

The socket adapter 18 is positioned over the backplane module 16 and has four sockets 20A through 20D for positioning the micro devices (not shown). One of the functions of the socket adapter 18 is to physically hold the micro devices in place while they are being programmed. The socket adapter 18 includes a ten-bit identification (ID) field so that it can be uniquely identified for the type of socket it carries, and therefore, the type of micro devices it may be able to hold. Since each interchangeable socket adapter 18 has a different type of socket depending on the manufacturer's device and package type, each socket adapter 18 needs to be uniquely identified using such an ID field.

In operation, the processor 12 first sets up the power and ground voltages for the micro devices to be programmed. To do that, the processor 12 provides control signals to the relay switch circuits 30A through 30D, via the logic circuit 26. This will set up the proper relay configuration such that power and ground are properly routed to each micro device and each socket 20A through 20D. Once power and ground are set up correctly, the processor 12 writes to the voltage source circuit 28 over the data/control bus 24 and sets the proper voltage levels for the micro device that needs to be programmed. These voltage levels would include the $V_{CC}$ supply for the micro device, the $V_{PP}$ supply which is also known as the programming supply voltage, and a third voltage $V_{IH}$ which is the voltage of the signals that are used to drive the micro device while it is programmed.

The logic circuit 26 provides the address and data from the address bus 22 and the data/control bus 24 directly to each micro device that is being programmed in each socket 20A through 20D. This arrangement makes this interface to appear as though the micro device is part of the processor card 11 and that it is directly connected to the address and data bus of the processor 12 and can be directly written to.

For different types of micro devices, different requirements exist for the number of address lines and/or the number of data lines needed to be accessed during each bus cycle. To accommodate different types of micro devices, the logic circuit 26 is capable of sizing each bus for each micro device to match the size of the micro device that is to be programmed.

Once the micro devices are considered part of the processor 12 bus and can be written to directly, a programming algorithm as stated by the micro device manufacturer will be followed to give the correct command sequence to the micro devices in order to program them. For a multi-socket design such as in this embodiment (four-socket design), the data to be written from the processor 12 to a micro device is sent simultaneously to the other three micro devices such that all four micro devices are programmed simultaneously.

Thus, a multiple number of micro devices can be programmed simultaneously using a programmer system constructed in accordance with the present invention. Therefore, the programming throughput can be increased significantly.

It would be evident to those skilled in the art that modifications could be made to allow micro devices in the sockets to be programmed in random order. This would be desirable when it is desired to keep the sockets as full as possible and the programming operations on-going as much as possible. As a micro device is programmed or found to be defective, it would be replaced and programing would start immediately.

Voltage Level-Shiftinz Translating Buffers

The present invention provides a buffer circuit for a programmer system that is designed to program a number of different micro devices. The buffer circuit provides a plurality of logic levels suitable to drive different types of micro devices during programming.

Figure 2:
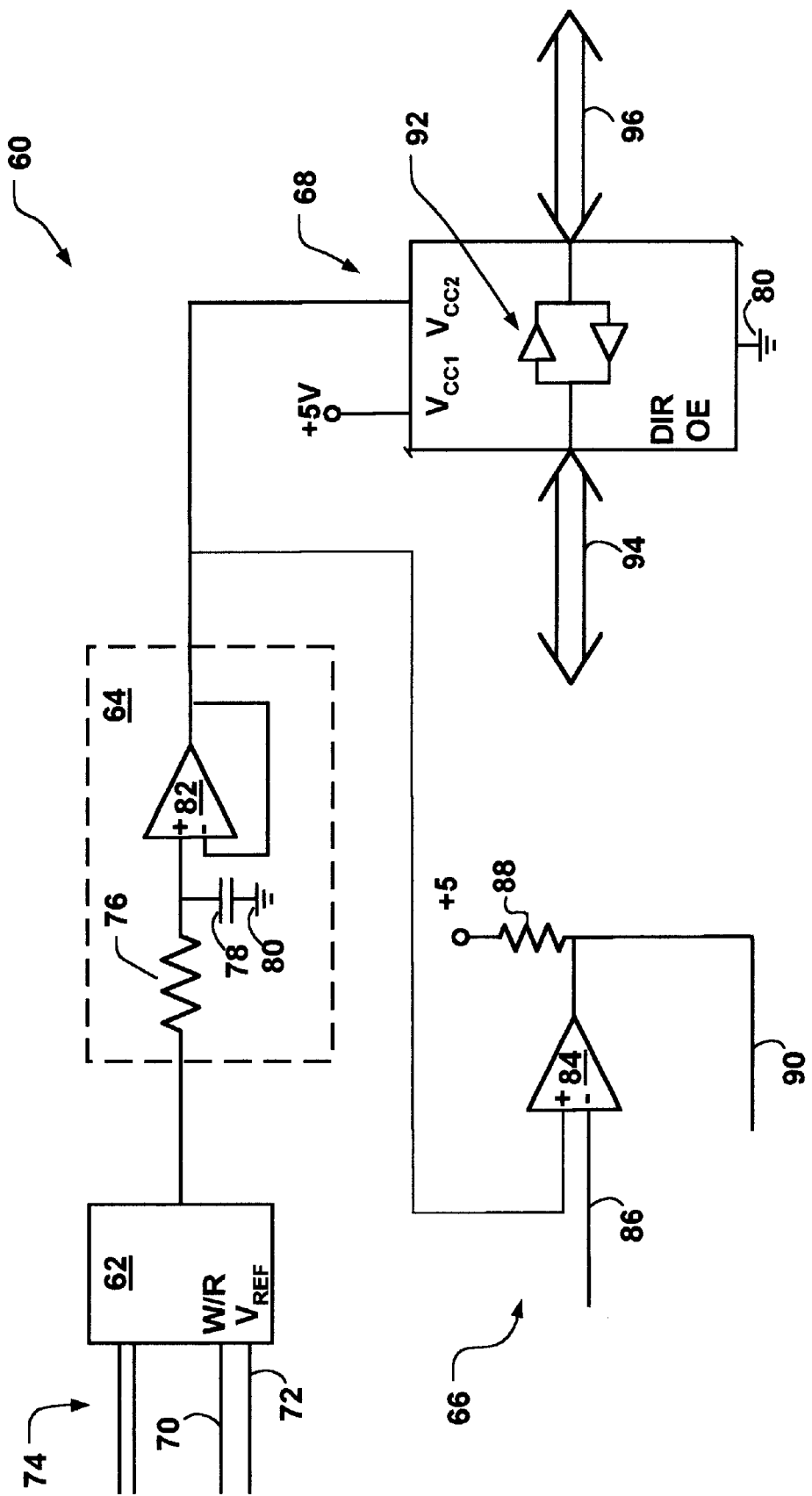
FIG. 2 is a schematic of the voltage level-shifing translating buffer of the present invention.

Referring to FIG.2, therein is shown a buffer circuit 60 for a programmer system, such as the programmer system 10, of FIG. 1. The buffer circuit 60 includes a digital-to-analog converter (DAC) 62, an amplifier 64, a calibration circuit 66, and a level-shifting translating buffer 68. The DAC 62 includes a read/write (W/R) terminal coupled to a processor, such as the processor 12 of FIG. 1, via line 70, a $V_{REF}$ terminal coupled to a reference voltage source (not shown) via conductive line 72. The DAC 62 is also coupled to the processor 12 for receiving control data signals therefrom over a data bus 74.

The amplifier 64 includes a resistor 76 having a first terminal coupled to the output of the DAC 62, a capacitor 78 having a first terminal coupled to a second terminal of the resistor 76 and a second terminal coupled to ground 80, an operational amplifier 82 having its positive terminal coupled to the first terminal of the capacitor 78 and its output terminal coupled to its negative terminal.

The calibration circuit 66 includes an operational amplifier 84 having its positive terminal coupled to the output terminal of the amplifier 64, its negative terminal coupled to a precision voltage reference via line 86 and its output terminal coupled to a first terminal of a resistor 88 and a calibration roll back via line 90. The second terminal of the resistor 88 is coupled to +5V.

The level-shifting translating buffer 68 includes a latch 92, a $V_{CC1}$ terminal coupled to +5V, a $V_{CC2}$ terminal coupled to the output terminal of the amplifier 64, the second terminal coupled to ground 80, a read/write direction (DIR) terminal, and an output enable (OE) terminal The level-shifting translating buffer 68 is coupled to the processor 12 for transferrring programming data over a bus 94 to the unprocessed micro devices, and coupled to the micro devices for transfering device data over a bus 96 to the processor 12.

In operation, the processor 12 sends control data signals to the DAC 62 over the data bus 74. The DAC 62 then generates a first variable DC voltage based on the control data signals and the voltage reference $V_{REF}$. This voltage reference $V_{REF}$ defines the full-scale range of voltage that the DAC 62 can put out. For example, if a voltage reference $V_{REF}$ equals 10 volts, the DAC 62 has the capability of outputting voltages ranging from zero to 10 volts. In response to the first variable DC voltage, the amplifier 64 generates a second variable DC voltage. The second variable DC voltage is then provided to the level-shifting translating buffer 68.

The second variable DC voltage is used as a power source for the level-shifting translating buffer 68. $V_{CC1}$ is connected to a constant voltage supply and is used to interface the programming data from the processor 12 to its appropriate voltage level, in this case 5 volts. $V_{CC2}$, which is coupled to the second variable DC voltage, is used to control the bus 96 going out to the micro device. Since the second variable DC voltage controls the output level to the bus 96, the bus 96 is able to support 1.5-volt to 5-volt logic micro devices.

In this embodiment, the level-shifting translating buffer 68 is used to transfer the data from the processor 12 to the micro devices. With this particular configuration, the data coming from the processor 12 is always known to be of a certain logic level, i.e., whatever the processor 12 is designed to use. For a 5-volt logic on the processor 12 side, the level-shifting translating buffer 68 then translates the 5-volt logic levels to whatever the voltage that's applied to the $V_{CC2}$ terminal of the level-shifting translating buffer 68.

Thus, a buffer circuit for a programmer system can be formed in acccordance with the present invention to provide a plurality of logic levels suitable to drive micro devices with different voltage requirement during programming.

Direct-Write Programming

The present invention provides a method for programming a programmable micro device using a processor such that the processor address and data are used to supply the address and data required by the micro device. Instead of using a special bus cycle, the present invention uses the standard bus cycle from a processor for programming. Therefore, the programming speed and the programming throughput are increased significantly.

Figure 3:
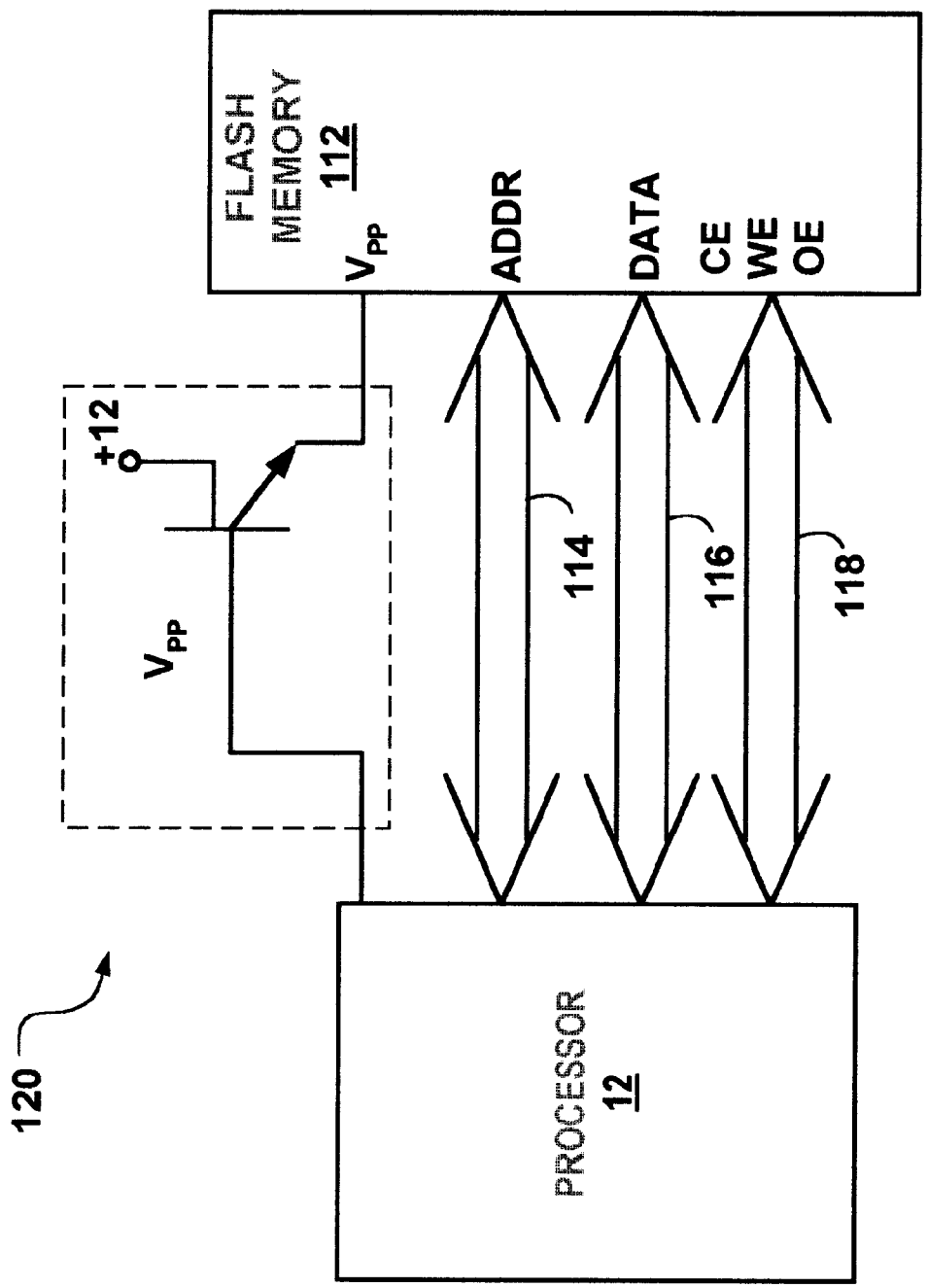
FIG. 3 is a schematic of the programmer system of the present invention in operation.

Referring to FIG. 3, therein is shown a processor, such as the processor 12, connected to a programmable micro device, such as a Flash memory device 112, via an address bus 114, a data bus 116, and a control bus 118. A $V_{PP}$ switch 120 is shown coupled between the processor 12 and a $V_{PP}$ terminal of the Flash memory device 112. The Flash memory device 112 includes a plurality of memory locations for storing data (not shown). The memory location is identified by a respective plurality of addresses (not shown). The memory locations and identifications are characteristics of such devices.

The memory address location that will be written or read to by the processor 12 will be sent over the address bus 114. The data bus 116 carries the data from the processor 12 to the Flash memory device 112. The data bus 116 is bi-directional in that the processor 12 can write this data to the Flash memory device 112 or the Flash memory device 112 can output the data for the processor 12 to read.

The control bus 118 carries the control signals from the processor 12 to the Flash memory device 112 for generating chip-enable, write-enable, and output-enable signals. These signals control when the Flash memory device 112 is going to program and when it's going to output data for read operations.

In operation, the processor 12 sends out a valid address to the Flash memory device over the address bus 114, along with valid data that it wants to write over the data bus 116. The processor 12 ensures that the chip-enable of the Flash memory device 112 is in an active state which is typically low; and then sends the write-enable pulse to the Flash memory device 112 over the control bus 118.

The high-to-low transition on the write-enable pulse, which is on the control bus 118, will start the programming operation inside the Flash memory device 112. At that time the processor 12 must go back to a specific address. After the programming operation has started, the processor 12 will typically put out a specific address and poll the data until specific data that is defined in the programming specification is read back on the data lines.

By checking the data that is returned on the data bus 116 and comparing it with the data sent by the processor 12 over the data bus 116, the processor 12 can determine whether the programming has been performed successfully. If the data sent by the processor 12 is different from the data that is read back, the Flash memory device 112 have not been programmed successfully. The Flash memory device 112 may be programmed again and then go through the same data comparison again. The programming, followed by the data comparison, can be repeated for a predetermined number (N) of times before the Flash memory device 112 is considered to be a reject. When this happens, the processor 12 will provide a signal, such as turning on an LED or sounding an alarm, to indicate a programming failure. This is repeated throughout the entire address space, or at least the block of data that is required to be programmed into the Flash memory device 112. Once this operation is completed, the device is considered programmed.

Further operations usually require a verification to ensure that the Flash memory device 112 was properly programmed. In which case, the processor 12 will go back to wherever it has stored its expected data and then repeat the earlier process of putting out each address, reading back the data, and comparing it against the data that it intended to write into the Flash memory device 112. This would validate that the programming operation did indeed happen correctly and that the Flash memory device 112 was properly programmed.

When the $V_{PP}$ switch is used for older memory devices that require a special programming voltage, the $V_{PP}$ switch would be inactive or turned off during the read-back, or verification mode.

Thus, by using the standard bus cycle from a processor for programming a micro device using the processor in accordance with the present invention, the programming speed and the programming throughput can be increased significantly.

Gang-Data Compare

The present invention provides a data compare circuit and a method for verifying data programmed by a programmer in a plurality of programmed micro devices using a single read-back operation. Thus the programming speed and the programming throughput for a programmer that performs multi-device programming can be increased significantly.

Figure 4:
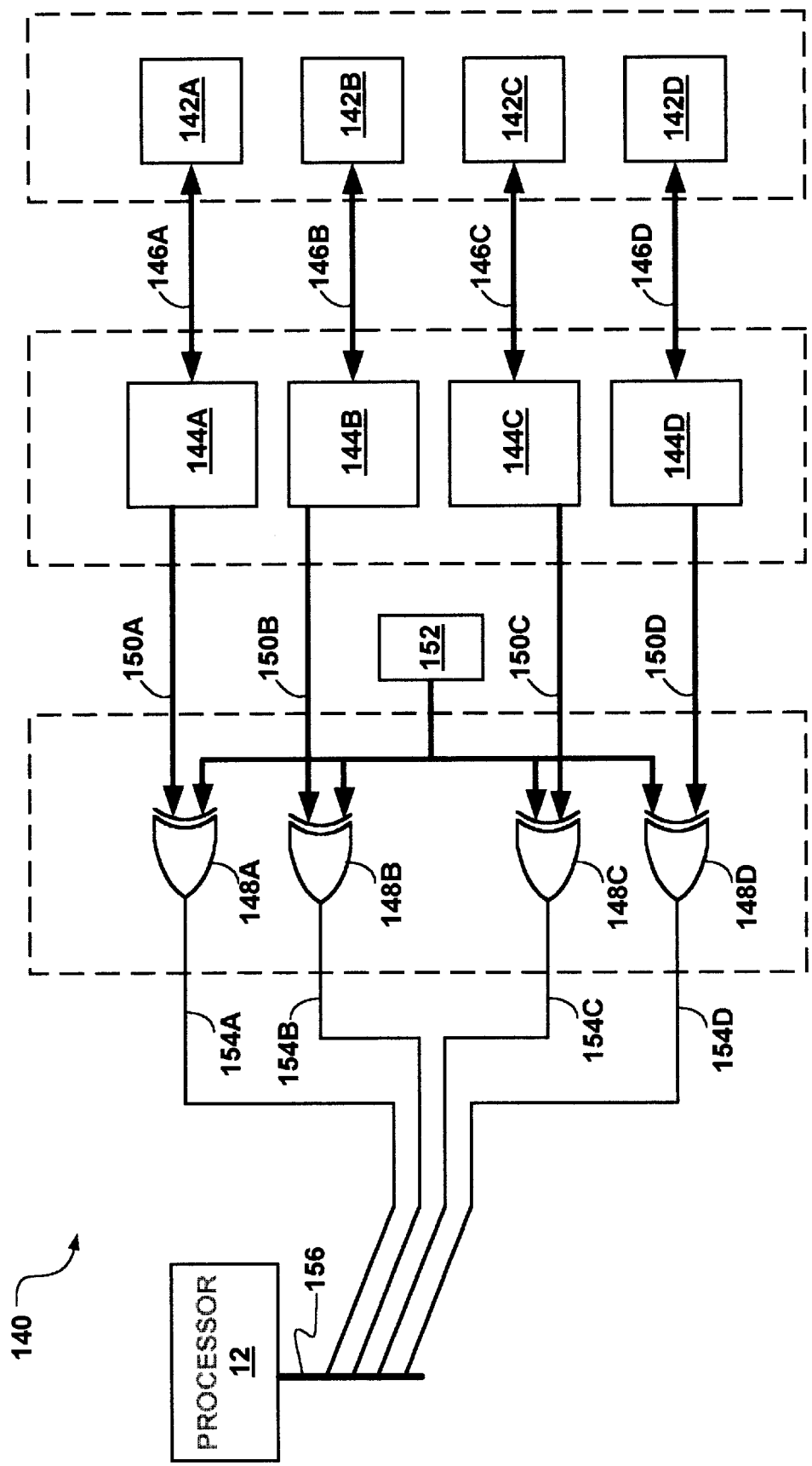
FIG. 4 is a schematic of a portion of the programmer system of the present invention.

Referring to FIG. 4, therein is shown a programmer 140 constructed in accordance with the present invention which is capable of programming unprogrammed micro devices into programmed micro devices. The programmer 140 includes four sockets (142A through 142D) for placement of processed micro devices (not shown); four data buffer/registers (144A through 144D) coupled to the four sockets (142A through 142D) over data busses 146A through 146D, respectively, for receiving data stored in a first address in each of the four processed micro devices; four compare circuits (148A through 148D), an expected data register 152, a processor bus 156 and the processor 12 coupled to the processor bus 156. In this embodiment, the compare circuits include exclusive OR gates.

Each of the four data buffer/registers 144A through 144D is coupled to a first terminal of a respective one of the compare circuits 148A through 148D over data busses 150A through 150D, respectively. The expected data buffer/register 152 is coupled to a second terminal of each of the compare circuits 148A through 148D. The output terminals of the compare circuits 148A through 148D are coupled to the processor bus 156 via lines 154A through 154D, respectively.

To begin the verification process (data compare or read-back operation), the four data buffer/registers 144A through 144D presents the data being read from the four micro devices (not shown) inserted in sockets 142A through 142D. The data comes from a first address in each of the micro devices during the read operation. The output of the latched data in each of the data buffer/registers 144A through 144D is then compared with the expected data provided by the expected data register 152 using the compare circuits 148A through 148D. In this embodiment, each of the compare circuits 148A through 148D includes an exclusive OR gate. The output of each of the compare circuits 148A through 148D will be at a first logic level if the data from the micro device matches the expected data from the expected data register 152. Otherwise, the output will be at a second logic level. The output of each of the compare circuits 148A through 148D is then put out as a bit (represented by either the first logic level or the second logic level) to the processor bus 156 over each of the lines 154A through 154D. The processor 12 reads back the output of the each of the compare circuits 148A through 148D over microprocessor bus 156 as part of the read cycle for this read operation.

The logic levels represented by the four bits coming out of the compare circuits 148A through 148D identify the micro device that failed the compare operation. If there is no failure, the verification can be allowed to continue with the next address. If there is a failure, the data from sockets 142A through 142D can be read directly out of the data buffer/registers 144A through 144D. The expected data can be read from the expected data register 152. A comparison can then be made by the processor 12 to determine which bits of the data had failed.

When a micro device failed the data compare operation, it may be considered as a reject. Alternatively, a micro device that failed the data compare operation may be reprogrammed for a number of times before it is considered a reject.

It should be noted that the width of the data busses 150A through 150D is the same the width as a regular data bus for the micro devices. For example, if the micro device is a 16-bit device, then each of the data busses 150A through 150D will be 16-bits wide. Therefore, the compare circuits 148A through 148D compares sixteen data lines, with a single output indicating that those sixteen lines passed or failed.

Thus, the data compare circuits and method according to the present invention verify data programmed by a programmer in a plurality of programmed micro devices by using a single read-back operation. Thus the programming speed and the programming throughput for a programmer that performs multi-device programming can be increased significantly.

From the above it will be understood that the present invention is applicable to what can be described as "micro devices". Micro devices include a broad range of electronic and mechanical devices. The best mode describes processing which is programming for programmable devices, which include but are not limited to devices such as Flash memories (Flash), electrically erasable programmable read only memories ($E^2$PROM), programmable logic devices (PLDs), field programmable gate arrays (FPGAs), and microcontrollers. However, the present invention encompasses processing for all electronic, mechanical, hybrid, and other devices which require testing, measurement of device characteristics, calibration, and other processing operations. For example, these types of micro devices would include but not be limited to devices such as microprocessors, integrated circuits (ICs), application specific integrated circuits (ASICs), micro mechanical machines, micro-electromechanical (MEMs) devices, micro modules, and fluidic systems.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A processing mechanism for processing unprocessed micro devices into processed micro devices, comprising:
   a processor for generating address signals, data signals and control signals;
   a pin driver module coupled to the processor;
   a backplane module coupled to the pin driver module; and
   at least one socket coupled to the backplane module, the at least one socket for placement of the unprocessed micro devices; wherein:
      the pin driver module routes the address signals, data signals and control signals to the backplane module, and provides a first plurality of voltages to the backplane module;
      the backplane module routes the address signals, data signals and control signals to the at least one socket, and provides a second plurality of voltages to the at least one socket.

2. The processing mechanism as claimed in claim 1 wherein:
   the backplane module includes:
      a relay switch circuit for routing the address signals, data signals and control signals to the at least one socket, and
      a buffer circuit for providing the second plurality of voltages to the at least one socket.

3. The processing mechanism as claimed in claim 1 wherein:
   the pin driver module includes:
      a logic circuit for routing the address signals, data signals and control signals to the backplane module, and
      a voltage source circuit for providing the first plurality of voltages to the buffer circuit.

4. The processing mechanism as claimed in claim 3 wherein the logic circuit includes a field programmable gate array.

5. The processing mechanism as claimed in claim 3 wherein the voltage source circuit includes a digital to analog converter.

6. The processing mechanism as claimed in claim 3 wherein the first plurality of voltages includes a $V_{CC}$ voltage and a processing voltage for processing the unprocessed micro devices.

7. The processing mechanism as claimed in claim 3 wherein the first plurality of voltages includes a $V_{pp}$ voltage and a processing voltage for processing the unprocessed micro devices.

8. A processing mechanism for processing unprocessed micro devices into processed micro devices, comprising:
   a processor for generating address signals, data signals and control signals;
   a pin driver module coupled to the processor, the pin driver module including a logic circuit and a voltage sources circuit;
   a backplane module coupled to the pin driver module, the backplane module including a relay switch circuit and a buffer circuit; and
   at least one socket coupled to the backplane module, the at least one socket for placement of the unprocessed micro devices; wherein:
      the logic circuit routes the address signals, data signals and control signals to the backplane module, and the voltage source circuit provides a first plurality of voltages to the buffer circuit;
      the relay switch circuit routes the address signals, data signals and control signals to the at least one socket, and the buffer circuit provides a second plurality of voltages to the at least one socket.

9. The processing mechanism as claimed in claim 8 wherein the logic circuit includes a field programmable gate array.

10. The processing mechanism as claimed in claim 8 wherein the voltage source circuit includes a digital-to-analog converter.

11. The processing mechanism as claimed in claim 8 wherein the first plurality of voltages includes a $V_{CC}$ voltage and a processing voltage for processing the unprocessed micro devices.

12. The processing mechanism as claimed in claim 8 wherein the first plurality of voltages includes a $V_{pp}$ voltage and a processing voltage for processing the unprocessed micro devices.

13. A buffer circuit for a processing mechanism capable of processing unprocessed micro devices into processed micro devices, the processing mechanism having a processor for generating control data signals and processing data signals and for receiving device data signals, a voltage reference source for providing a voltage reference, and a $V_{CC1}$ voltage supply for providing a $V_{CC1}$ voltage, and at least one socket for placement of the unprocessed micro devices, the programming data signals are of $V_{CC1}$ volt logic levels, comprising:
   a digital-to-analog converter (DAC) coupled to the processor and the voltage reference source, the DAC responsive to the control data signals and the voltage reference to generate a first variable DC voltage;
   an amplifier coupled to the DAC, the amplifier responsive to the first variable DC voltage to generate a second variable DC voltage; and
   a level-shifting translating buffer coupled to the amplifer, the processor, the $V_{CC1}$ voltage supply, and the socket for transferring processing data signals from the processor to the unprocessed micro devices and for transferring the device data signals from the processed micro devices to the processor, the level-shifting translating buffer responsive to the $V_{CC1}$ voltage and the second variable DC voltage to provide a plurality of logic levels for the device data signals.

14. The buffer circuit as claimed in claim 13 wherein the first variable voltage has a value between 0 volt and the voltage reference.

15. The buffer circuit as claimed in claim 13 wherein the amplifier is an operational amplifier.

16. The buffer circuit as claimed in claim 13 wherein the plurality of logic levels is between 0 volts and $V_{CC1}$ volts.

17. A method for programming a programmable micro device using a processor, the programmable micro device having a plurality of memory locations for storing data, the memory locations being identified by a respective plurality of addresses, the programmable micro device being coupled to the processor via an address bus, a data bus and a control bus, comprising the steps of:

(a) providing a first address from the processor to the programmable micro device over the address bus;

(b) providing a first data corresponding to the first address from the processor to the programmable micro device over the data bus; and (c) providing a first control signal from the processor to the programmable micro device over the control bus to enable the programmable micro device to accept the first data from the processor at a memory location identified by the first address in the programmable micro device.

18. The method as claimed in claim 17 including the steps of:

(d) providing a second control signal from the processor to the programmable micro device over the control bus to enable the programmable micro device to provide to the processor data stored in the memory location identified by the first address over the data bus; and (e) comparing the data stored in the memory location identified by the first address in the programmable micro device with the first data.

19. The method as claimed in claim 18 including the steps of:

(f) repeating steps (a) through (e) when the data stored in the memory location identified by the first address in the programmable micro device is not identical to the first data.

20. The method as claimed in claim 19 including the steps of:

(g) providing a signal by the processor to indicate a programming failure when, after repeating steps (a) through (e) for a predetermined number (N) of times, the data stored in the memory location identified by the first address in the programmable micro device is still not identical to the first data, wherein N is an integer.

21. A method for reading a programmable micro device using a processor, the programmable micro device having a plurality of memory locations for storing data, the memory locations being identified by a respective plurality of addresses, the programmable micro device being coupled to the processor via an address bus, a data bus and a control bus, comprising the steps of:

(a) providing a first address from the processor to the programmable micro device over the address bus; and (b) providing a first control signal from the processor to the programmable micro device over the control bus to enable the programmable micro device to provide a first data from a memory location identified by the first address in the programmable micro device over the data bus.

22. A programming mechanism capable of programming unprogrammed micro devices into programmed micro devices, the programmed micro devices having a plurality of memory locations for storing data, the plurality of memory locations being identified by a respective plurality of addresses, comprising:

a plurality of sockets for placement of processed micro devices;

a plurality of data buffer/registers, each of the plurality of data buffer/registers coupled to a respective one of the plurality of sockets for receiving a first data stored in a first address in each of the programmed micro devices;

a plurality of compare circuits, each of the plurality of compare circuits having a first input and a second input and one output, the first input of each of the plurality of compare circuits being coupled to a respective one of the data buffer/registers for receiving the first data;

an expected data register coupled to the second input of each of the respective plurality of compare circuits for providing a first expected data;

a processor bus; and a processor coupled to output of each of the plurality of compare circuits over the processor bus, wherein each of the compare circuits provides a first logic level at the output when the first data matches with the first expected data, and provides a second logic level at the output when the first data does not match with the first expected data.

23. The programming mechanism as claimed in claim 22 wherein the compare circuits are exclusive OR gates.

24. A method for verifying data programmed in a plurality of programmed micro devices using a programming mechanism capable of programming unprogrammed micro devices into programmed micro devices, the programmed micro devices having a plurality of memory locations for storing data, the plurality of memory locations being identified by a respective plurality of addresses, comprising steps of:

(a) providing to each of a plurality of data buffer/registers a first data stored in a first address in each of the plurality of programmed micro devices;

(b) providing the first data to a first input of each of a plurality of compare circuits;

(c) providing a first expected data from an expected data register to a second input of each of the plurality of compare circuits;

(d) comparing the first data with the first expected data using the plurality of compare circuits;

(e) outputting a first logic level at an output of a respective one of the plurality of compare circuits when the first data matches with the first expected data, and (f) outputting a second logic level at the output of a respective one of the plurality of compare circuits when the first data does not match with the first expected data.

25. The method as claimed in claim 24 including the steps of:

(g) identifying, after step (f), the programmed micro devices that include the first data which does not match with the first expected data by detecting a logic level at the output of the plurality of compare circuits.

26. The method as claimed in claim 25 including the steps of:

(h) programming, after step (g), the programmed micro devices when the programmed micro devices include the first data which does not match with the first expected data.

27. The method as claimed in claim 25 including the steps of:

(i) rejecting, after step (g), the programmed micro devices when the programmed micro devices include the first data which does not match with the first expected data.

28. The method as claimed in claim 25 including the steps of:

(j) repeating steps (a) to (f) for a second data stored in a second address in each of the plurality of programmed micro devices.

* * * * *

UNITED STATES PATENT AND TRADEMARK OFFICE
CERTIFICATE OF CORRECTION

PATENT NO. : 6,535,780 B1
DATED : March 18, 2003
INVENTOR(S) : Anderson et al.

It is certified that error appears in the above-identified patent and that said Letters Patent is hereby corrected as shown below:

Column 2,
Line 10, delete "quipment" and insert therefore -- equipment --

Column 4,
Line 49, delete "correpsonding" and insert therefore -- corresponding --

Column 5,
Line 27, delete "level-shifing" and insert therefore -- level-shifting --

Column 7,
Line 13, delete "Shiftinz" and insert therefore -- Shifting --
Line 50, delete "transferrring" and insert therefore -- transferring --
Line 52, delete "transfering" and insert therefore -- transferring --

Signed and Sealed this

Twenty-second Day of April, 2003

JAMES E. ROGAN
*Director of the United States Patent and Trademark Office*

UNITED STATES PATENT AND TRADEMARK OFFICE
CERTIFICATE OF CORRECTION

| | | |
|---|---|---|
| PATENT NO. | : 6,535,780 B1 | Page 1 of 1 |
| APPLICATION NO. | : 09/471675 | |
| DATED | : March 18, 2003 | |
| INVENTOR(S) | : George Leland Anderson et al. | |

It is certified that error appears in the above-identified patent and that said Letters Patent is hereby corrected as shown below:

In column 4, line 23, before "converter" delete "digitalto-analog" and insert -- digital-to-analog --, therefor.

In column 4, line 26, before "the processor" delete "amplifer" and insert -- amplifier --, therefor.

In column 9, line 8, before "have" insert -- may --.

In column 11, line 61, before "circuit" delete "sources" and insert -- source --, therefor.

In column 11, line 46, before "buffer" delete "the" and insert -- a --, therefor.

In column 12, line 45, after "the" delete "amplifer" and insert -- amplifier --, therefor.

Signed and Sealed this

Thirtieth Day of March, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 6,535,780 B1 | Page 1 of 1 |
| APPLICATION NO. | : 09/471675 | |
| DATED | : March 18, 2003 | |
| INVENTOR(S) | : George Leland Anderson et al. | |

It is certified that error appears in the above-identified patent and that said Letters Patent is hereby corrected as shown below:

In column 4, line 23, before "converter" delete "digitalto-analog" and insert -- digital-to-analog --, therefor.

In column 4, line 26, before "the processor" delete "amplifer" and insert -- amplifier --, therefor.

In column 9, line 8, before "have" insert -- may --.

In column 11, line 67, before "circuit" delete "sources" and insert -- source --, therefor.

In column 11, line 46, before "buffer" delete "the" and insert -- a --, therefor.

In column 12, line 45, after "the" delete "amplifer" and insert -- amplifier --, therefor.

Signed and Sealed this

Sixth Day of April, 2010

David J. Kappos
*Director of the United States Patent and Trademark Office*

UNITED STATES PATENT AND TRADEMARK OFFICE
CERTIFICATE OF CORRECTION

PATENT NO. : 6,535,780 B1  Page 1 of 1
APPLICATION NO. : 09/471675
DATED : March 18, 2003
INVENTOR(S) : George Leland Anderson et al.

It is certified that error appears in the above-identified patent and that said Letters Patent is hereby corrected as shown below:

This certificate vacates the Certificate of Correction issued April 6, 2010. The certificate is a duplicate of the Certificate of Correction issued March 30, 2010. All requested changes were included in the Certificate of Correction issued March 30, 2010.

Signed and Sealed this

Eighteenth Day of May, 2010

David J. Kappos
*Director of the United States Patent and Trademark Office*